United States Patent [19]

Bril et al.

[11] 4,238,277

[45] Dec. 9, 1980

[54] METHOD OF MANUFACTURING A MAGNETIC DEVICE

[75] Inventors: Thijs W. Bril; Lambertus Postma, both of Eindhoven, Netherlands

[73] Assignee: U.S. Philips Corporation, New York, N.Y.

[21] Appl. No.: 959,558

[22] Filed: Nov. 9, 1978

Related U.S. Application Data

[63] Continuation of Ser. No. 815,109, Jul. 13, 1977, abandoned.

[30] Foreign Application Priority Data

Jul. 20, 1976 [NL] Netherlands .................... 7608002

[51] Int. Cl.$^3$ ................................................ B44C 1/22
[52] U.S. Cl. ...................................... 156/643; 156/646
[58] Field of Search ................................. 427/127–130, 427/48; 156/643, 646

[56] References Cited

U.S. PATENT DOCUMENTS

| | | | |
|---|---|---|---|
| 3,808,068 | 4/1974 | Johnson et al. ...................... | 156/643 |
| 4,013,803 | 3/1977 | Josephs ................................ | 423/131 |
| 4,030,967 | 6/1977 | Ingrey et al. ......................... | 156/643 |
| 4,060,448 | 11/1977 | Nemiroff et al. .................... | 427/131 |

*Primary Examiner*—Bernard D. Pianalto
*Attorney, Agent, or Firm*—Marc D. Schecter

[57] ABSTRACT

A method of manufacturing a magnetic device for propagating and detecting magnetic domains. At least one thin domain layer of a magnetizable material is provided on a nonmagnetic substrate body and hereon are provided a number of layers of which there are at least a detection layer of magnetoresistive material and a layer of electrically insulating nonmagnetic material. The latter is provided with a propagation layer of magnetizable material in a pattern which satisfies the requirements of propagation of magnetic domains and the requirements of detecting magnetic domains. The non-covered parts of at least the layer of electrically insulating, nonmagnetic material and of the layer of magnetoresistive material are successively removed, each time by means of a method which does not substantially attack the pattern of the material present above the relevant layer.

5 Claims, No Drawings

METHOD OF MANUFACTURING A MAGNETIC DEVICE

This is a continuation of application Ser. No. 815,109, filed July 13, 1977, now abandoned.

BACKGROUND OF THE INVENTION

The invention relates to a method of manufacturing a magnetic device comprising at least one thin domain layer of a magnetizable material which has an easy axis of magnetisation which is substantially normal to the surface of the layer, a detection pattern of magnetoresistive material and a propagation pattern of magnetizable material being provided on said layer, the method comprising the step of providing a nonmagnetic substrate body with at least one thin layer of a magnetizable material and the step of providing said layer of magnetizable material, by means of mask technology, with the propagation pattern of magnetizable material and with the detection pattern of magnetoresistive material.

Such a method is known from AIP Conference Proceedings No. 24 Magnetism and Magnetic Materials 1974 pp. 556–557. The magnetic device is used for propagating and detecting magnetic domains. The configuration of the pattern of magnetizable material is such that the magnetic domains are propagated by means of a magnetic field. For this purpose, the configuration satisfies that of a propagation element for magnetic domains. The configuration of the pattern of magnetoresistive material is such that the magnetic domains are detected by means of an electric current. For this latter purpose the configuration satisfies that of a detection element for magnetic domains. In the method the layer of magnetizable material is covered with an $SiO_2$ layer by sputtering. Vapor deposited on said $SiO_2$ layer is a permalloy film on which a propagation structure of permalloy is provided by means of a first mask. This is the pattern of magnetizable material. Parts of the permalloy film are then removed by means of a second mask by means of sputter-etching, such that the detection pattern of magnetoresistive material remains. In this method the second mask has to be aligned very accurately with respect to the pattern of magnetizable material already present. It is stated in the article that as a result of this alignment requirement in the manufacture of the device the size of the domains is restricted to not less than a diameter of 1 $\mu$m.

SUMMARY OF THE INVENTION

The invention provides a method in which said restriction does not occur and by means of which a magnetic device can be manufactured in which domains can be used having a diameter even smaller than 1 $\mu$m.

According to the invention, the thin layer of magnetizable material is provided with a detection layer of magnetoresistive material and with a layer of at least partly electrically insulating, substantially nonmagnetic material on top thereof. The latter layer is provided, by means of a mask, with a layer of magnetizable material, in the shape of the propagation pattern of magnetizable material and of the detection pattern of magnetoresistive material. The non-covered parts of the layer of at least partly electrically insulating, substantially nonmagnetic material and the layer of magnetoresistive material being then successively removed, each time using a method which does not substantially attack the pattern of the material present above the layer being etched. Both the propagation pattern of magnetizable material and the detection pattern of magnetoresistive material are realized while using one mask, so that no alignment problems occur. The two patterns have substantially the same configuration, which has certain additional advantages.

Each layer is removed by means of an etching method which does not substantially attack the pattern of the material present above the layer being etched. For this purpose there are several possibilities. For example, a method may be used which does not substantially attack the relevant materials as such. Other possibilities are methods of directed removal; examples hereof are sputter-etching, so-called "ion milling", that is sputter etching with a parallel ion beam, and plasma-etching, that is etching in a reactive gas. In this latter method the material to be removed is attacked chemically so that this constitutes a very selective manner of removal. The method to be used for any particular layer is determined by the properties of the material to be removed and, if it is a method of non-directed removal, also by the properties of the material of the pattern present on the layer which, as a matter of fact, should not substantially be attacked. It is advantageous that the method of removing certain parts of a layer does not substantially attack the underlying layer.

Preferably, the methods used should not adversely influence the propagation of magnetizable material. If a method as such should indeed adversely influence the pattern of magnetizable material, this can be prevented by ensuring that said pattern is covered, for example, with a lacquer which is removed afterwards. If a method does not adversely influence the magnetic properties of the pattern of magnetizable material but does reduce the thickness of said pattern, this can be mitigated by providing said pattern in such a thickness that ultimately it remains in the desired thickness.

In the method the thin domain layer of magnetizable material is at least provided with a detection layer of magnetoresistive material and with a layer of at least partly insulating, substantially nonmagnetic material. In the case in which the device comprises patterns of other materials, the thin domain layer of magnetizable material is also provided with layers of said other materials. For example, when the device comprises, between the pattern of magnetoresistive material and the pattern of magnetizable material, a pattern of electrically conductive, substantially nonmagnetic material which is separated from the pattern of magnetoresistive material by a pattern of at least partly electrically insulating, substantially nonmagnetic material, the thin domain layer of magnetizable material is provided successively with a layer of magnetoresistive material, a layer of at least partly electrically insulating, substantially nonmagnetic material, and a layer of electrically conductive, substantially nonmagnetic material.

Several possibilities are available for shaping the propagation layer of magnetizable material in the form of the propagation and detection patterns by means of the mask. For example, on the one hand etching or sputter-etching, after providing a continuous layer of magnetizable material which is covered partly with a lacquer, and on the other hand electrolytic deposition of the layer in the form of the desired pattern.

In the step the non-covered parts of the layer present below the propagation pattern of magnetizable material are removed. Since the method used does not substantially attack the pattern of magnetizable material, the pattern of magnetizable material thus serves as a mask.

In the subsequent step, the then non-covered parts of the next layer are removed. Since the method used does not substantially attack the pattern of material which is present above said layer, said pattern serves as a mask.

It is to be noted that a method in which a pattern of magnetoresistive material is manufactured by means of one mask, which pattern has such magnetic properties that it functions both to propagate and detect magnetic domains, is known from IEEE Transactions on Magnetics vol. MAG 9 No. 3 September 1973, pp. 478–480. Since the pattern of this one material should satisfy both the requirements regarding propagation and those regarding detection, realization of these requirements is possible only by means of a compromise with respect to the thickness of the pattern and the properties of the material. In other words, a single pattern of material performing both functions will not perform either function as well as two separate patterns of material, each performing a single function.

DESCRIPTION OF THE PREFERRED EMBODIMENTS

EXAMPLE 1

A 2000 Å thick layer of $SiO_x$, where x is approximately 2, is provided by sputtering on a 5 μm thick magnetizable domain layer which consists of $Sm_{0.3}Y_{2.7}Ga_{1.2}Fe_{3.8}O_{12}$ and is present on a substrate consisting of gadolinium-gallium-garnet. On said layer of $SiO_x$ is provided by sputtering a 400 Å thick magnetoresistive detection layer of nickel-iron with 80 at.% Ni and 20 at.%Fe. A 5000 Å thick layer of $SiO_x$, where x is approximately 2, is provided hereon by sputtering and a 5000 Å thick magnetizable propagation layer of nickel-iron with 80 at.% Ni and 20 at% Fe is provided thereon. By means of a mask having smallest details of 3 μm, said top propagation layer is provided with a 1.1 μm thick pattern of a positive photolacquer Shipley AZ 1350 H. By means of a wet-chemical etching treatment the parts of the 5000 Å thick propagation layer of nickel-iron not covered with lacquer are removed in a few seconds. A solution of 40 ml $H_2SO_4$, 20 ml $H_2O$, 10 ml $HNO_3$ and 0.5 ml HCl is used for the wet-chemical etching treatment. The lacquer is then removed with acetone. A propagation pattern of nickel-iron having smallest details of 3 μm is now present on the 5000 Å thick layer of $SiO_x$. A plasma etching treatment is then carried out for 10 minutes with a gas mixture of $CF_4$ and 3% by volume of $O_2$ with an overall gas pressure of 1 Torr and a power of 500 Watts. The non-covered parts of the $SiO_x$ are removed, the nickel-iron of the propagation pattern not being attacked and the magnetic properties thereof being maintained. The nickel-iron of the 400 Å thick layer is not attacked either, so that this method selectively removes only the $SiO_x$. A pattern consisting of a layer of $SiO_x$ and a layer of nickel-iron having smallest details of 3 μm is now present on the 400 Å thick detection layer of nickel-iron. A sputter-etching treatment is now carried out with a power of 250 Watts and a pressure of Ar of 10 milli-Torr. It has been found that the non-covered parts of the 400 Å thick layer detection layer of nickel-iron are removed in 3 minutes. Since sputter-etching is a method of directed removal, the pattern of $SiO_x$ present on the 400 Å thick detection layer of nickel-iron is not attacked. During sputtering, an approximately 400 Å thick surface layer of the 5000 Å thick detection pattern of nickel-iron is also removed indeed. Now a pattern in sandwich structure of 400 Å thick nickel-iron, 5000 Å thick $SiO_x$ and approximately 4600 Å thick nickel-iron having smallest details to an accuracy of 3 μm remains on the 2000 Å thick layer of $SiO_x$.

EXAMPLE 2

In the manner described in Example 1, a 2000 Å thick layer of $SiO_x$, wherein x is approximately 2, a 400 Å thick detection layer of nickel-iron with 80 at.% Ni and 20 at.% Fe, a 5000 Å thick layer of $SiO_x$, where x is approximately 2, and a 1000 Å thick propagation layer of nickel-iron with 80 at.% Ni and 20 at.% Fe are provided successively on a 5 μm thick magnetizable domain layer consisting of $Sm_{0.3}Y_{2.7}Ga_{1.2}Fe_{3.8}O_{12}$ which is present on a substrate consisting of gadolinium-gallium garnet. By means of a mask which has smallest details of 3 μm and which, compared with the mask used in Example 1, is a negative mask, said layer is provided with a 1.1 μm thick pattern of a positive lacquer Shipley AZ 1350 H. Nickel-iron with a thickness of 5000 Å is deposited electrolytically on the non-covered parts of the layer of nickel-iron. This is done in a bath containing 130 g of $NiCl_2.6H_2O$, 28.5 g $Fe(NH_4)_2(SO_4)_2.6H_2O$, 40 g of $H_3BO_3$, 2 g of saccharin and 0.2 g of sodium-laurylsulphate per liter for 20 seconds with a current density of 50 mA/cm². The lacquer is then removed by means of acetone. A layer of nickel-iron of 1000 Å is then removed by sputter-etching; this is done with a power of 250 Watts and an Ar pressure of 10 milliTorr in a time duration of 13 minutes. The nickel-iron is removed from the grown parts and from the non-grown parts. A propagation pattern of nickel-iron, thickness 5000 Å and smallest details of 3 μm is now present on the 5000 Å thick layer of $SiO_x$. In the manner described in Example 1 the non-covered parts of the $SiO_x$ are now removed by plasma-etching and the parts of the 400 Å thick detection layer of nickel-iron then exposed are removed by sputter-etching. In this case a pattern, in sandwich structure, of 400 Å thick nickel-iron, 5000 Å thick $SiO_x$ and approximately 4600 Å thick nickel-iron having smallest details to an accuracy of 3 μm remains on the 2000 Å thick layer of $SiO_x$.

What is claimed is:

1. A method of manufacturing a magnetic device comprising a thin domain layer of a magnetizable material which has an easy axis of magnetization which is substantially normal to the surface of said layer, a detection pattern of magnetoresistive material and a propagation pattern of magnetizable material, wherein the method comprises the steps of:

providing a nonmagnetic substrate with a thin domain layer of magnetizable material;

depositing, on top of the domain layer, three successive layers comprising a layer of at least partly electrically insulating, substantially nonmagnetic material sandwiched between a detection layer of a magnetoresistive material and a propagation layer of a magnetizable material;

shaping the uppermost layer into the form of a mark from which the remaining two layers are shaped; and successively removing the uncovered portions of the next two layers by the use of an etching method which does not substantially attack the materials present above the layer being etched.

2. The method of claim 1, wherein the detection layer is adjacent the domain layer, and where the propagation layer is the uppermost, top layer.

3. A method as claimed in claim 2, wherein the uncovered portions are removed by a directed removal etching method.

4. A method as claimed in claim 3, wherein the uncovered portions are removed by plasma-etching.

5. A method as claimed in claim 2 wherein the etching method substantially does not attack the underlying layer.

* * * * *

UNITED STATES PATENT OFFICE
CERTIFICATE OF CORRECTION

Patent No. 4,238,277   Dated December 9, 1980

Inventor(s) Thijs W. Bril et al

It is certified that error appears in the above-identified patent and that said Letters Patent are hereby corrected as shown below:

Col. 4, line 62, Change "mark" to -- mask --

Signed and Sealed this

Third Day of March 1981

[SEAL]

Attest:

RENE D. TEGTMEYER

Attesting Officer    Acting Commissioner of Patents and Trademarks